United States Patent
Giboney et al.

(10) Patent No.: US 6,930,240 B1
(45) Date of Patent: Aug. 16, 2005

(54) FLEX-CIRCUIT SHIELDED CONNECTION

(75) Inventors: Kirk S. Giboney, Santa Rosa, CA (US); Adam E. Robertson, Rohnert Park, CA (US); Xiaohui Qin, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 12 days.

(21) Appl. No.: 10/805,057

(22) Filed: Mar. 18, 2004

(51) Int. Cl.[7] .................................................. H05K 9/00

(52) U.S. Cl. ...................... 174/35 C; 439/497; 174/36

(58) Field of Search .................... 174/35 R, 35 C, 174/36; 439/497, 610

(56) References Cited

U.S. PATENT DOCUMENTS

| | | | | |
|---|---|---|---|---|
| 4,644,092 A | * | 2/1987 | Gentry | 174/36 |
| 4,926,007 A | * | 5/1990 | Aufderheide et al. | 174/36 |
| 5,387,113 A | * | 2/1995 | Dickerson et al. | 439/98 |
| 5,532,429 A | * | 7/1996 | Dickerson et al. | 174/36 |
| 5,900,589 A | * | 5/1999 | Brunt | 174/120 R |

\* cited by examiner

*Primary Examiner*—Hung V. Ngo

(57) ABSTRACT

An electrical interconnection includes a flex-circuit having a signal conductor and a shield conductor. A mating surface of the flex-circuit has a signal conductor portion surrounded by a shield conductor portion. The signal conductor portion is electrically coupled to the signal conductor and the shield conductor portion is electrically coupled to the shield conductor.

20 Claims, 2 Drawing Sheets

FLEX-CIRCUIT SHIELDED CONNECTION

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

FIELD OF THE INVENTION

The present invention relates generally to electrical interconnections, and more particularly to shielded electrical interconnections.

BACKGROUND OF THE INVENTION

Electrical circuits are often connected using electrical cables, such as wire, twisted wire pairs, wire ribbons, and coaxial cables. Shielded cables are used in some applications to avoid receiving electromagnetic interference, or to avoid transmitting electromagnetic interference along the cable. Some cable structures, such as coaxial cable used to couple relatively high-frequency electrical signal between electronic circuits, provide a shielding structure (e.g. the outer conductor) surrounding a signal-carrying structure (e.g. center conductor). Coaxial connectors support transverse electromagnetic wave ("TEM") transmission over a broad bandwidth (frequency range), including direct-current ("DC") transmission.

Coaxial connectors are used with coaxial cable to retain the advantages of the coaxial geometry, such as full shielding. Coaxial connectors are sometimes used to connect a coaxial cable to a planar transmission structure in a printed circuit board ("PCB"). Multiple metal layers in the PWB can provide essentially full shielding for signals traveling along transmission structures. Similarly, the coaxial cables are typically cut to the desired length and connectors attached, typically by soldering and/or crimping, to each end of the cable. Unfortunately, coaxial connectors are typically bulky and heavy. The ergonomics of such connectors (e.g. the ability to attach and remove the connector(s) by hand) limit the size of the connector and thus the interconnection density.

Flexible film cables ("flex cables") are also used as cabling between electronic circuits. Flex cables are fabricated using photolithographic transfer processes similar to those used to manufacture PCBs. These processes allow several parallel transmission structures to be made in a single flex cable. Flex cables approximate the shielding of coaxial cable using multiple metal layers and interconnecting vias that are normal to the metal layers.

A variety of techniques have been used to attach flex cables to PCBs. One approach uses metal balls, such as solder balls, pressed against corresponding contacts on the PCB. Another approach uses array contacts, or multi-pin connectors. Unfortunately, these types of connections do not offer the benefits of a fully shielded flex cable connector interface.

BRIEF SUMMARY OF THE INVENTION

An electrical interconnection includes a flex-circuit having a signal conductor and a shield conductor. A mating surface of the flex-circuit has a signal conductor portion surrounded by a shield conductor portion. The signal conductor portion is electrically coupled to the signal conductor and the shield conductor portion is electrically coupled to the shield conductor.

DETAILED DESCRIPTION OF THE EMBODIMENTS

I. Introduction

The present invention enables flex-circuit shielded connections ("FCSCs") for connecting one or more transmission lines in one flexible circuit to a corresponding transmission line(s) in another circuit. The second circuit is a rigid circuit board, a machined connector, or another flexible circuit, for example.

Conventional microwave and millimeter-wave connectors are typically machined. They are typically comparable to or slightly smaller than a human finger to facilitate hand connection and removal. Mechanical relief of the connector-cable junction may also affect the size of the connector.

In addition to conventional connectors being relatively large, they are also relatively long, in other words, the distance over which the electromagnetic wave travels inside the mated connectors between transmission lines is typically larger than the cross-sectional dimension of the transmission lines.

By reducing the distance signals travel through the connector and using a photolithographic transfer process for fabricating connector surfaces on flex-circuits, which maintains high dimensional tolerances, FCSCs are made with better performance and at lower cost than conventional, machined microwave and millimeter wave connectors. FCSCs have few parts, and a variety of housings and other techniques are used to connect flex-circuits to corresponding circuits.

In some embodiments, an FCSC connector is integrally formed with the transmission line in the flex-circuit, avoiding the labor-intensive processes of stripping cables, insertion of portions of the cables to corresponding portions of conventional connectors, and soldering, crimping, or otherwise attaching the cable to the connector. Housing pieces used in some embodiment of FCSC systems are loaded onto PCBs using standard circuit-loading equipment and techniques. In some embodiments, flex-circuits with multiple signal lines and/or multiple transmission lines are connected with FCSCs.

In some embodiments, such as when a flex-circuit and mating circuit includes stripline transmission lines, the connection distance of an FCSC can be as short as about the height of two blind vias, or roughly equivalent to the total ground-to-ground thickness of a stripline. Such a small distance between transmission lines minimizes effects of non-ideal fabricated dimensions.

Thus, the overall height (connector length) of an FCSC can be much shorter than conventional microwave and millimeter wave connectors. Furthermore, the cable is substantially parallel to the mounting surface(s) (see FIG. 1A, ref. num. 26), which allows circuits and connectors to be mounted in a smaller space.

II. An Exemplary Flex-Circuit

Figure 1A:
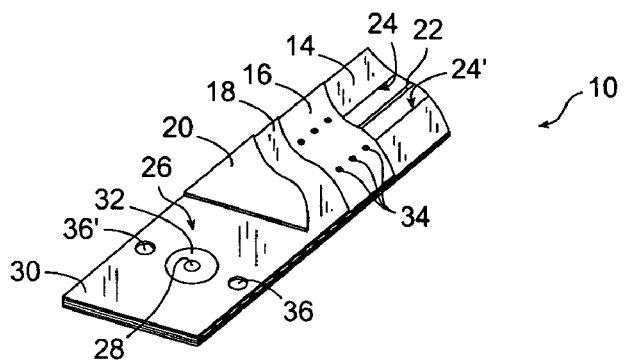
FIG. 1A shows a partial cut-away isometric view of a flex-circuit according to an embodiment of the present invention.

FIG. 1A shows a partial cut-away isometric view of a flex-circuit 10 according to an embodiment of the present invention. The flex-circuit 10 includes metal layers 14, 18 separated by a dielectric layer 16. A dielectric layer 20 is usually included over the "top" metal layer 18 for environmental protection, electrical isolation (i.e. to prevent the metal layer 18 from shorting-out other conductors), and/or as a solder mask. The flex-circuit 10 includes another dielectric layer (not shown) under metal layer 14, and a "bottom" metal layer (not shown) covered with a dielectric layer (not shown). Alternatively, flex-circuits have more or fewer layers.

Flex-circuit 10 includes a stripline waveguide having a signal conductor 22 cooperating with ground planes 24, 24', in addition to the top and bottom metal layers. Various types of transmission lines can be fabricated in flex-circuits, such as a microstrip, stripline, or coplanar waveguides. A planar mating surface 26 of the flex-circuit 10 includes a signal conductor portion 28 and a shield portion 30 formed in metal layer 18, separated by a dielectric portion 32. The terms "signal conductor" and "shield conductor" are used for convenience of discussion. Those of skill in the art appreciate that the conductors operate in a complementary fashion, and thus signals travel along both the "signal conductor" and the "shield conductor." Similarly, the term "planar mating surface" includes mating surfaces that have surface features, such as a slight depression between the signal conductor portion and shield portion, or conductive particles or cross-hatching that roughen the mating surface. Similarly, the flex-circuit is flexible, so the term "planar mating surface" includes mating surfaces that are formed in a substantially planar fashion, and then are twisted and/or bent.

Metal layer 18 is shown as being a continuous sheet of metal, but could be a grid or portions of the metal layer 18 could be a grid. A metal grid that has sufficiently fine pitch provides electrical shielding essentially equal to a continuous metal sheet. A variety of metals are used for the metal or metal grid layers, such as copper, gold, silver, or aluminum. Similarly, other conductors, such as metal alloys, organic conductors, or superconductors are used. Other types of transmission lines may have fewer metal layers. For example, a microstrip transmission line can be fabricated in a two (metal)-layer flex-circuit; however, such a structure would not be shielded on one side of the flex-circuit.

The flex-circuit 10 is fabricated in a multilayer, planar, photolithographic transfer process. Various process steps add or subtract materials according to a pattern that is transferred using photolithography. Holes are fabricated in a layer or layers by drilling, cutting, milling, punching, laser ablating, chemical etching, and other methods. In a typical flex-circuit, layers of metal are separated by layers of dielectric material. Metal layers or selected portions of metal layers are electrically coupled together using vias 34. The vias continue along both sides of the signal conductor 22 and in a semi-circle around the signal conductor portion 28 of the planar mating surface 26. The vias are plated and/or filled with metal (e.g. solder) to electrically connect metal layer 18 to the ground planes 24, 24' formed in metal layer 14 (and connecting the underlying metal layer (not shown) to metal layer 18 and ground planes 24, 24'), thus essentially surrounding the signal conductor 22 to provide shielding. The signal conductor portion 28 is electrically connected to the signal conductor 22 with a via (not shown) extending through the dielectric layer 16. Optional alignment references 36, 36' are included for aligning the mating surface 26 to a corresponding circuit.

As an alternative to using vias to connect metal layers in a flex-circuit, a process that removes large portions of the layers around the signal conductor can be used to fabricate a shielded ridge structure. The shield of the shielded ridge structure would encircle the signal conductor with a continuous metal surface, similar to a coaxial waveguide.

The flex-circuit 10 is shown as being substantially planar, or "ribbon-like." However, some embodiments of the invention allow the planar mating surface 26 to bend and/or twist, such as when connected to a mating flex-circuit or other circuit with a bendable mating surface. Similarly, some flex-circuits have layers shaped to provide varying thicknesses. For example, when a flex-circuit has a stripe of dielectric material (not shown) formed over the signal conductor and adjacent dielectric sections (i.e. the non-conductive region between the signal conductor 22 and the ground planes 24, 24'), but not over the ground planes 24, 24'. Then, a metal layer is formed over the stripe of dielectric material and the ground planes 24, 24'. The resulting structure approximates a conventional coaxial cable structure, and has more thickness variation across a section of the flex-circuit than the flex-circuit shown in FIG. 1A (i.e. is not as "planar"), but such flex-circuits are still generally referred to as "planar".

Figure 1B:
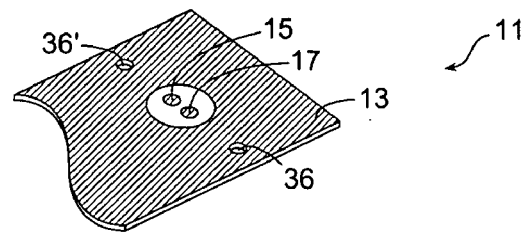
FIG. 1B shows an isometric view of a portion of a flex-circuit with a metal grid layer according to an embodiment of the present invention.

FIG. 1B shows an isometric view of a portion of a flex-circuit 11 with a metal grid layer 13 according to an embodiment of the present invention. Two signal conductor portions 15, 17, such as are used in differential transmission lines, are surrounded by a shield portion of the metal grid layer. The signal conductors in the flex cable are both surrounded by shielding. The use of a photolithographic transfer process for fabricating the critical dimensions of an FCSC simplifies the fabrication of complex connections, such as those involving multiple signal conductors, because of the precision afforded by photolithography. Problems that are difficult, such as matching signal conductor lengths in conventional differential transmission lines, are easily enabled by embodiments of the present invention. A flex-circuit with differential signal conductors is typically used with a corresponding second circuit (i.e. a second differential transmission line) and a corresponding interposer, if any.

Metal grid layers are easier to fabricate and use in some applications. For example, a metal grid layer reduces thermal distortion compared to a continuous metal layer in some applications. A typically grid pitch is about 0.5–1.25 mm;

however, these values are merely exemplary and the pitch is selected according to the intended application, such as the amount of shielding required and the highest expected frequency of operation. The dimensions of the grid and the materials used determine the shielding effectiveness. They also influence the transmission line characteristics if the metal grid layer is used as part of the transmission line. Other types of patterned metal layers are alternatively used. Patterned metal layers are also used in embodiments with a single signal conductor. Optional alignment references 36, 36' align the signal conductor portions with a mating circuit or interposer (not shown).

Figure 1C:
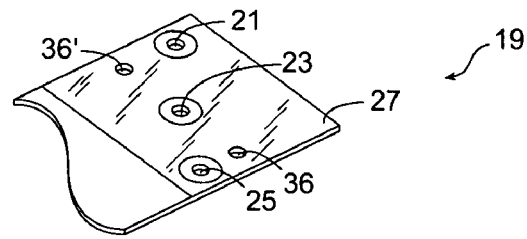
FIG. 1C shows an isometric view of a portion of a flex-circuit with multiple signal conductor portions according to another embodiment of the present invention.

FIG. 1C shows an isometric view of a portion of a flex-circuit 19 with multiple signal conductor portions 21, 23, 25 according to another embodiment of the present invention. A shield portion 27 surrounds each of the signal conductor portions 21, 23, 25, which may couple to center conductors of stripline waveguides in the flex-circuit 11, for example.

III. Exemplary Flex-Circuit Shielded Connections

Figure 2:
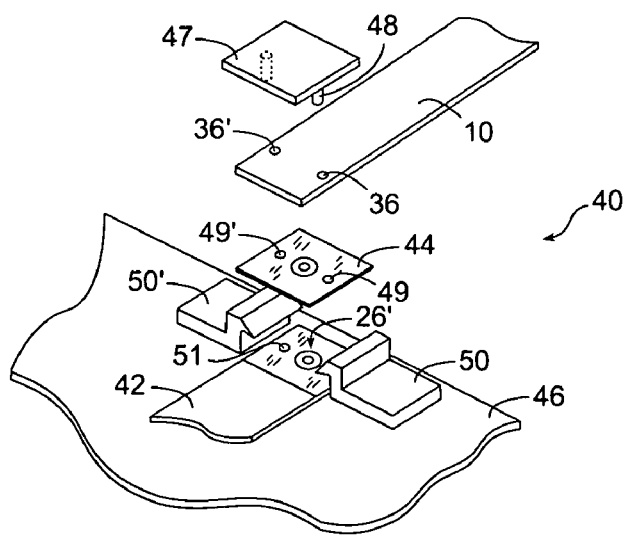
FIG. 2 shows an exploded isometric view of a flex-circuit shielded connection system according to an embodiment of the present invention.

FIG. 2 shows an exploded isometric view of a FCSC system 40 according to an embodiment of the present invention. The flex-circuit 10 shown in FIG. 1 is coupled to a second circuit 42 using an optional interposer 44. The second circuit 42 includes a second transmission line (not shown), typically having a second shielded signal conductor. The second circuit is shown on a PCB 46 for purposes of illustration. Alternatively, the second circuit is fabricated within the layers of a multi-layer PCB and is coupled to the mating surface 26 of flex-circuit 10 through a second mating surface 26'. While planar mating surfaces are shown, other shapes (e.g. curved or stepped mating surfaces) are alternatively used. In some embodiments, the flex-circuit is coupled to a conventional transmission line through a machined connector that mates to the mating surface 26 of the flex-circuit 10. In one embodiment the interposer 44 is a two-metal-layer flex-circuit. Each metal layer forms a mating surface, and the mating surfaces are connected with through vias.

A housing top 47 includes alignment members 48 that extend through alignment references 36, 36' in the flex-circuit 10, and similar alignment references 49, 49', 51 in the interposer 44 and second circuit 42, respectively, to align the mating surfaces of the FCSC system 40. The alignment members 48 are preferably non-conductive, and are pins, barbed pins, screws, or bolts for example. The alignment reference 51 (and an alignment reference (not shown) corresponding to alignment member 48) typically extend into or through the PCB 46. The thickness of the housing top 47 and other components are selected so that the housing top snaps into housing bases 50, 50' when the FSCS system 40 is assembled, applying a selected amount of pressure to hold the mating surfaces in contact with each other. Alternatively, alignment members are provided on the PCB or as part of a connector housing. In a further or alternate embodiment, the housing incorporates a latching mechanism that allows the FCSC to be easily connected and disconnected. Alternatively, the housing top is bolted to the PCB. In yet other embodiments, the conductor patterns are held in contact by solder, adhesive, or fusing. It is generally desirable that the diameters of the alignment members are only slightly less than the corresponding alignment references to provide accurate alignment of the FCSC.

The housing top and bases are fabricated using any of a variety of techniques. In one embodiment, the housing pieces are fabricated using an injection molding process. Injection molding provides high-tolerance housing parts at relatively low cost. The mating contact force in an FCSC is maintained by compliance of spring forces in the components and housing in conjunction with a mechanism that latches or otherwise secures the FCSC. In a typically application, the flex-circuit and other circuit are aligned and pressed together until the latching mechanism engages. The connection is manually unlatched by squeezing, spreading, or pressing parts to disengage the latching mechanism. In some embodiments, no tools are required for latching or unlatching the FCSC. The clamping of the housing top 47 in the housing bases 50, 50' holds the surfaces of the circuits 10, 42 and interposer 44 together and electrically couples one circuit to the other.

If the shielded conductor is a center conductor in a high-frequency transmission line, it is typically desired that both transmission lines (i.e. the transmission line in the flex-circuit and the transmission line in the second circuit) have the same characteristic impedance (e.g. 50 ohms). In such applications it is also desirable that the FCSC system maintain the characteristic impedance from one transmission line to the next. Changes in the geometry or material properties of a transmission line or connector can cause a reflection, scattering, or radiation of electromagnetic energy. Such effects are usually undesirable in transmission lines and connectors. FCSCs according to embodiments of the present invention provide shielding to reduce scattering and radiation, and in some embodiments provide controlled impedance from one transmission line to the next to avoid causing reflections, scattering, or radiation of electromagnetic energy. The geometries and dimensions of the conductors and dielectrics used for transmission lines of various configurations and impedance are known to those skilled in the art.

The optional interposer 44 is a device that couples the mating surface 26 of the flex-circuit 10 to the corresponding mating surface 26' of the second circuit 42. In one embodiment, the interposer is a sheet of flexible or rigid dielectric material with through holes in a selected pattern (see FIG. 3B). The through holes are filled with an electrically conductive elastomer or "C" springs, for example. Alternatively, the interposer 44 is compliant (compressible) and includes mating surface patterns as are on the flex-circuit and second circuit, with electrical interconnections through the interposer coupling one mating surface to the other. In other embodiments, the interposer provides rough conductive mating surfaces, such as metal or metalized particles, to enhance the electrical coupling between the flex-circuit to another circuit. Alternatively, one or more of the conductive mating surfaces is scuffed, honed, or otherwise roughened. In an alternative embodiment, the interposer is omitted and the conductive mating surfaces on the FCSC and/or corresponding conductive mating surfaces on the mating connector are roughened with conductive particles or otherwise.

In yet another embodiment, the interposer is a sheet of "Z-axis" conductor or adhesive. A Z-axis conductor only conducts electricity perpendicular to the major surfaces of the sheet. Z-axis conductors using chains of conductive balls, oriented conductive fibers, and oriented conductive wires are known and commercially available. The conductive elements are usually dispersed in an elastomeric material. When the Z-axis conductor sheet is pressed between mating surfaces on the flex-circuit and the second circuit, the signal conductor portions and shield portions are electrically coupled together through the conductive elements in the Z-axis conductor (see FIG. 4). The Z-axis conductor does not have to be patterned with mating surfaces, and is available in a variety of products, such as sheet and tape. Interposers are discussed in further detail below in reference to FIG. 3B.

Figure 3A:
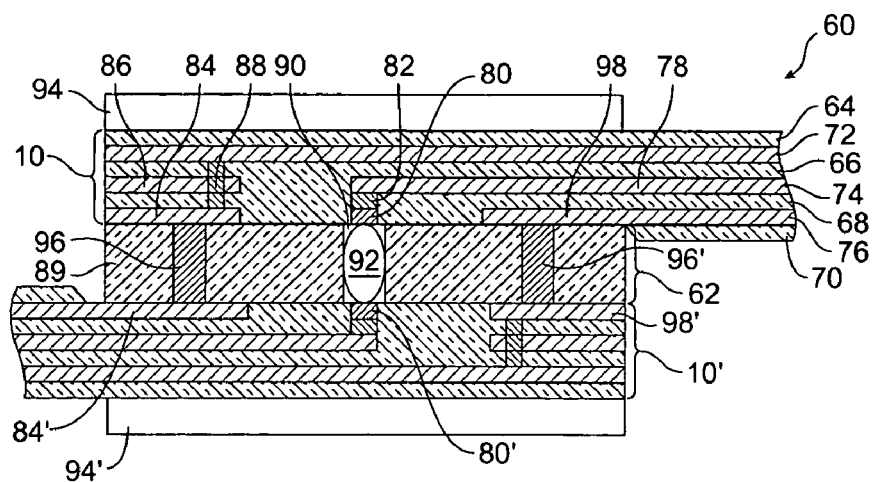
FIG. 3A is a cross section of a flex-circuit shielded connection according to an embodiment of the present invention.

FIG. 3A is a cross section of a flex-circuit shielded connection system 60 according to an embodiment of the present invention. A first flex-circuit 10 is coupled to a second flex-circuit 10' through an interposer 62. The first flex-circuit 10 includes dielectric layers 64, 66, 68, 70 and metal layers 72, 74, 76. A shielded conductor 78 formed in metal layer 74 is coupled to a signal conductor portion 80 formed in metal layer 76 through a via 82. Similarly, a shield conductor portion 84 is coupled to a ground portion 86 of metal layer 74 and to metal layer 72 through a via 88. The second flex-circuit 10' has similar features.

Vias are essentially holes. Vias can have arbitrary size, shape, and dimensions. Plated vias are vias in which metal is deposited to line the side walls of the via. "Plated through vias" penetrate all layers and connect any conductor in the via path to all other conductors in via path. "Blind vias" do not penetrate all layers, and blind plated vias connect only conductors on the layers they penetrate. Signal conductor pattern(s) at the mating surface of a flexible circuit can be connected to signal conductor(s) of a transmission line in the flex-circuit using blind vias. A shield conductor pattern at the mating surface of the flexible circuit encircles or effectively encircles the signal conductor pattern(s) at the mating surface, and can be connected to the shield conductor(s) of the transmission line in the flex-circuit with multiple through vias.

The interposer 62 includes a body 89 that is a plate or sheet of dielectric material, with a C-spring 90 in a center hole 92. Plates 94, 94, apply pressure between the first and second flex-circuits 10, 10' and compress the C-spring 90 to couple the first signal conductor portion 80 to a second signal conductor portion 80'. The C-spring is conductive, such as gold-plated beryllium-copper, and provides a wiping action to the signal conductor portions 80, 80' that results in a good electrical connection. C-springs provide spring force between mating faces, allowing the interposer body to be rigid. In some embodiments, the connector housing or other mechanism provides a slight horizontal movement between mating surfaces that facilitates a good electrical connection. The plates 94, 94' are rigid plastic or metal, for example, held together with edge clips or nuts and bolts. Alternatively, the C-clip is replaced with a conductive elastomeric material.

Conductive elastomeric material 96, 96', such as is available from CHOMERICS NORTH AMERICA of Woburn, Mass., fills other holes in the interposer body 89. The conductive elastomeric material typically has a length slightly longer and a diameter slightly smaller than the hole it extends through. When the mating surfaces of the flex-circuits are pressed against the interposer, the conductive elastomeric material compresses and couples the shield conductor portions 84, 84', 98, 98' of the mating surfaces of the flex-circuits through the interposer. Alternatively, the conductive elastomeric material 96, 96' is replaced with C-springs.

Figure 3B:
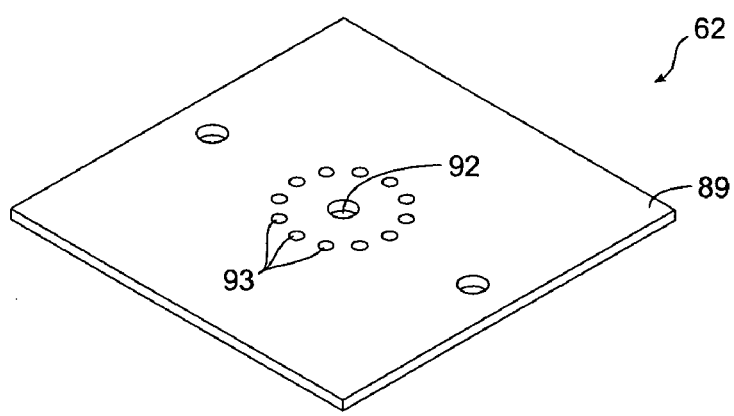
FIG. 3B is an isometric view of the interposer shown in FIG. 3A.

FIG. 3B is an isometric view of the interposer 62 shown in FIG. 3A. A signal conductor hole 92 in the interposer body 89 accepts a C-spring, conductive elastomeric material, or other conductive element, such as solder to couple signal conductors between a flex-circuit and other circuit. Shield conductor holes 93 surround the signal conductor hole 92 and are also filed with conductive elements, which may be of the same type as the conductive element in the center hole 92 or of a different type. The conductive elements in the shield conductor holes 93 shield the signal conductor hole 92 when connected to the corresponding shielding portions of the circuits (FIG. 3A, ref. nums. 84, 84', 98, 98'). In some embodiments, the spacing of the shield conductor holes 93 from the signal conductor hole 92, in conjunction with the diameter of the signal conductor hole 92 and material of the interposer body 89, is chosen to provide a selected impedance, such as a characteristic impedance of a transmission line in a flex-circuit that the interposer 62 is to be used with. The interposer body 89 is made of a dielectric material such as polyimide, liquid crystal polymer, expanded polytetrafluoroethylene ("PTFE"), and dielectric materials used to fabricate PCBs, such as glass-epoxy composite and ceramic-filled composite.

Figure 4:
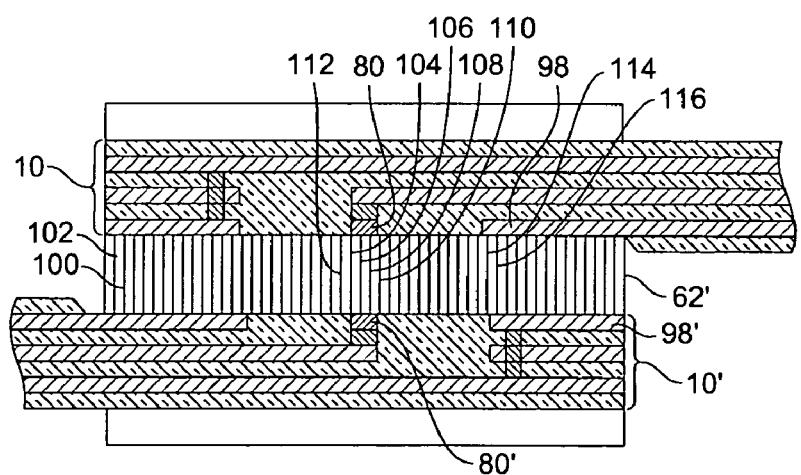
FIG. 4 is a cross section of a flex-circuit shielded connection according to an embodiment of the present invention.

FIG. 4 is a cross section of a flex-circuit shielded connection according to another embodiment of the present invention. Flex-circuits 10, 10' are connected using an interposer 62' of Z-axis conductive material. The interposer 62' includes a number of conductive elements 100, 104, 106, 108, 110, 112, 114, 116 aligned essentially perpendicular to the mating surfaces of the flex-circuits (i.e. plane of the interposer). The conductive elements are typically dispersed in a viscous material, such as an adhesive material, or an elastomeric material. The material between the conductive elements generally isolates them from each other, avoiding electrical conduction in the plane of the interposer.

The Z-axis conductive material does not have to be patterned to couple the mating surfaces of the flex-circuits. For example, three conductive elements 104, 106, 108 couple one signal conductor portion 80 to the other 80'. Conductive elements 110, 112 on either side of the signal conductor portions do not contact a conductive portion of either flex-circuit 10, 10', while conductive elements 114, 116 couple the shielding portions 98, 98' of the mating surfaces together. Conductive elements 114, 116 and similar conductive elements (not shown) also surround the signal conductor portions to provide shielding, similar to the shield conductor holes 93 shown in FIG. 3B, and in some embodiments an impedance-matched connection to the impedance of a transmission line in the flex-circuit 10.

While the preferred embodiments of the present invention have been illustrated in detail, it should be apparent that modifications and adaptations to these embodiments might occur to one skilled in the art without departing from the scope of the present invention as set forth in the following claims.

What is claimed is:

1. An electrical interconnection comprising:
   a flex-circuit having a signal conductor and a shield conductor;
   a mating surface of the flex-circuit having a signal conductor portion surrounded by a shield conductor portion, the signal conductor portion being electrically coupled to the signal conductor and the shield conductor portion being electrically coupled to the shield conductor.

2. The electrical interconnection of claim 1 wherein at least a portion of the shield conductor is a metal grid.

3. The electrical interconnection of claim 1 further comprising a second signal conductor portion of the mating surface surrounded by the shield conductor portion.

4. The electrical interconnection of claim 3 wherein the signal conductor portion and the second signal conductor portion are coupled to differential signal conductors in the flex-circuit.

5. The electrical interconnection of claim 3 wherein the signal conductor portion is coupled to a first signal conductor of a first waveguide in the flex-circuit and the second signal conductor portion is coupled to a second signal conductor of a second waveguide in the flex circuit.

6. The electrical interconnection of claim 1 further comprising alignment references in the mating surface of the flex circuit.

7. The electrical interconnection of claim 1 wherein the shield conductor portion of the mating surface is coupled to the shield conductor by at least a semi-circle of conductive vias.

8. The electrical interconnection of claim 1 further comprising:
   a second circuit having a second mating surface with a second signal conductor portion electrically coupled to the signal conductor portion and a second shield conductor portion electrically coupled to the shield conductor portion.

9. The electrical interconnection of claim 8 wherein at least one of the signal conductor portion, second signal conductor portion, shield conductor portion and second shield conductor portion includes conductive particles.

10. The electrical interconnection of claim 8 wherein the second circuit is a second flex-circuit.

11. The electrical interconnection of claim 8 wherein the second circuit is incorporated in a printed circuit board.

12. The electrical interconnection of claim 8 further comprising
   first alignment references in the mating surface; and
   second alignment references in the second mating surface.

13. The electrical interconnection of claim 8 wherein the second circuit comprises a machined or molded connector connected to a coaxial transmission structure.

14. The electrical interconnection of claim 8 wherein the second circuit is incorporated in a printed circuit board and wherein the flex-circuit and second circuit include alignment references, and further comprising:
   a housing base;
   a housing top;
   alignment members extending through the alignment references in the flex-circuit and second circuit, wherein the housing top cooperates with the housing base to provide a contact force to electrically couple the mating surface of the flex-circuit to the second mating surface of the second circuit.

15. The electrical interconnection of claim 8 further comprising an interposer disposed between the flex-circuit and the second circuit.

16. The electrical interconnection of claim 15 wherein the interposer comprises a Z-axis conductive material.

17. The electrical interconnection of claim 15 wherein the interposer has an interposer body having at least one signal conductor through hole and a plurality of shield conductor through holes surrounding the at least one signal conductor through hole.

18. The electrical interconnection of claim 17 further comprising C-springs in each of the plurality of shield conductor through holes and in the signal conductor hole.

19. The electrical interconnection of claim 17 further comprising conductive elastomer in each of the plurality of shield conductor through holes and in the signal conductor hole.

20. The electrical interconnection of claim 15 wherein the second circuit is incorporated in a printed circuit board and wherein the flex-circuit, interposer, and second circuit include alignment references, and further comprising:
   a housing base;
   a housing top;
   alignment members extending through the alignment references in the flex-circuit, interposer and second circuit, wherein the housing top cooperates with the housing base to provide a contact force to electrically couple the mating surface of the flex-circuit to the second mating surface of the second circuit through the interposer.

* * * * *